(12) United States Patent
Tay (10) Patent No.: US 8,228,408 B2
(45) Date of Patent: Jul. 24, 2012

(54) OPTIMIZED LIGHT GUIDE ARRAY FOR AN IMAGE SENSOR

(76) Inventor: Hiok Nam Tay, Singapore (SG)

( * ) Notice: Subject to any disclaimer, the term of this patent is extended or adjusted under 35 U.S.C. 154(b) by 0 days.

(21) Appl. No.: 12/941,004

(22) Filed: Nov. 5, 2010

(65) Prior Publication Data

US 2011/0102651 A1    May 5, 2011

Related U.S. Application Data

(60) Provisional application No. 61/258,581, filed on Nov. 5, 2009, provisional application No. 61/259,180, filed on Nov. 8, 2009.

(51) Int. Cl.
*H04N 5/335* (2011.01)
(52) U.S. Cl. .......................... 348/280; 348/294
(58) Field of Classification Search .................. 348/340, 348/272, 273, 275, 280, 281; 257/432; 250/226; 438/23, 64
See application file for complete search history.

(56) References Cited

U.S. PATENT DOCUMENTS

| 7,001,795 B2* | 2/2006 | Jiang et al. ................ 438/64 |
| 7,358,103 B2* | 4/2008 | Li et al. ..................... 438/29 |
| 2004/0227170 A1* | 11/2004 | Jiang et al. ................. 257/290 |
| 2009/0166518 A1 | 7/2009 | Tay et al. |
| 2010/0200738 A1 | 8/2010 | Yamashita |
| 2011/0284980 A1 | 11/2011 | Sakoh et al. |

FOREIGN PATENT DOCUMENTS

JP    2011-243753 A    12/2011

OTHER PUBLICATIONS

PCT/IB2010/055049 ISR & WO.

\* cited by examiner

*Primary Examiner* — Tuan Ho (57) ABSTRACT

An image sensor has a plurality of pixels in a pixel array. Each pixel includes a photoelectric conversion unit below an insulating layer and a light guide to transmit light to the photoelectric conversion unit. Across five or more pixels arrayed in a direction, the light guides have a spacing between them that varies non-monotonically across the five or more pixels. A width of the light guide and/or a horizontal pitch between consecutive light guides may vary non-monotonically across same. A light guide of a pixel that detects light of shorter wavelengths only may be narrower than a light guide of another pixel that detects light of longer wavelengths. A color filter may be coupled to the light guide. A width of a gap between consecutive color filters may vary non-monotonically across same. A pitch between the gaps may vary non-monotonically across same.

10 Claims, 10 Drawing Sheets

OPTIMIZED LIGHT GUIDE ARRAY FOR AN IMAGE SENSOR

CROSS-REFERENCE TO RELATED APPLICATIONS

This application claims priority to U.S. Provisional Patent Application No. 61/258,581 filed on Nov. 5, 2009 and U.S. Provisional Patent Application No. 61/259,180 filed on Nov. 8, 2009. This application also claims foreign priority to PCT Application No. PCT/IB2010/055049, filed on Nov. 5, 2010.

BACKGROUND OF THE INVENTION

1. Field of the Invention

The subject matter disclosed generally relates to structures and methods for fabricating solid state image sensors.

2. Background Information

Photographic equipment such as digital cameras and digital camcorders may contain electronic image sensors that capture light for processing into still or video images. Electronic image sensors typically contain millions of photoelectric conversion units such as photodiodes.

Solid state image sensors can be either of the charge coupled device (CCD) type or the complimentary metal oxide semiconductor (CMOS) type. In either type of image sensor, photoelectric conversion units are formed in a substrate and arranged in a two-dimensional array. Image sensors typically contain millions of pixels each comprising a photoelectric conversion unit to provide a high-resolution image. To improve an efficiency of light capturing, certain image sensors have light-guides (or waveguides) to direct light towards the photoelectric conversion units. The light-guides may comprise a light transmissive material, for example silicon nitride such as $Si_3N_4$, having a refractive index higher than that of a surrounding insulating material, for example silicon oxide, so that there is a total internal reflection at sidewalls of the light-guides to keep light from exiting. Alternatively, the light-guides may have a metal coating on sidewalls to provide the reflection and are filled with a transparent material, for example silicon oxide or an organic resin or spin-on-glass (SOG). A pixel may comprise more than one light guides, one stacked above another, to form a cascaded light guide. The light guides at any one height from the substrate are typically at a given pitch from one another, and share a common horizontal cross-sectional profile at any one given height from the substrate. Keeping a constant pitch provides a uniform sampling of the image projected on the face of the image sensor along left-to-right and top-to-bottom directions (parallel to the plane of the pixel array), thus better matched to how pixels are arrayed on displays such as computer displays and prints.

BRIEF SUMMARY OF THE INVENTION

According to a first aspect of the disclosure, an image sensor comprises a pixel array that comprises a plurality of pixels, where each pixel comprises (a) a photoelectric conversion unit below an insulating layer and below a plurality of wires that are also embedded in the insulating layer, and (b) a light guide embedded in the insulating layer and between the plurality of wires to transmit light to the photoelectric conversion unit, where a horizontal spacing between the light guides of each pair of consecutive pixels among five or more pixels that are arrayed side-by-side in a direction and that are among the plurality of pixels varies non-monotonically across the five or more pixels. The light guide may contain a dye or a color pigment. The color pigment may be an organic pigment or an inorganic pigment or an organometallic pigment.

In the first aspect, it is desirable that a horizontal pitch between the light guides of each pair of consecutive pixels among the five or more pixels varies non-monotonically across the five or more pixels. It is further desirable that the horizontal pitch varies by 0.1 um or more across the five or more pixels. It is still further desirable that the horizontal pitch varies by 0.2 um or more across the five or more pixels.

In the first aspect, the pixel may further comprise a color filter coupled to transmit light to the photoelectric conversion unit via the light guide, there being a gap between the color filters of each pair of consecutive pixels among the five or more pixels, the gap having a width that varies non-monotonically across the five or more pixels. It is desirable that the gap width varies by 0.1 um or more across sixteen pixels arrayed side-by-side in a direction. It is more desirable that the gap width varies by 0.2 um or more across the sixteen pixels.

In the first aspect, the pixel may further comprise a color filter coupled to transmit light to the photoelectric conversion unit via the light guide, there being a gap between the color filters of each pair of consecutive pixels among the five or more pixels, and a gap pitch varies non-monotonically across the five or more pixels, the gap pitch being a horizontal distance (in a plane parallel to the plane of the photoelectric conversion units) between each pair of consecutive center-lines of the gaps. It is desirable that the gap pitch varies by 0.1 um or more across sixteen pixels arrayed side-by-side in a direction. It is more desirable that the gap pitch varies by 0.2 um or more across the sixteen pixels.

The gap may contain air or a gas. Alternatively, the gap may contain a liquid or solid material that has a refractive index that is at least 20% less than that of the color filter. It is also desirable that the gap has a width not more than 0.45 um between the adjacent color filters. It is further desirable that the gap is topped with a convex ceiling. It is still further desirable that there is at least 0.6 um from a bottom of the color filter to a top of the convex ceiling.

According to a second aspect of the disclosure, an image sensor comprises a pixel array that comprises a plurality of pixels, where each pixel comprises (a) a photoelectric conversion unit below an insulating layer and below a plurality of wires that are also embedded in the insulating layer, and (b) a light guide embedded in the insulating layer and between the plurality of wires to transmit light to the photoelectric conversion unit, where the light guide has a width that varies non-monotonically across the five or more pixels. It is further desirable that the width of the light guide is smaller for a pixel among the five or more pixels that is configured to detect lights of shorter wavelengths only than for another pixel among the five or more pixels that is configured to detect lights of longer wavelengths. It is also further desirable that the width of the light guide is smaller for a blue pixel than for a red pixel. It is also further desirable that the width of the light guide is smaller for a blue pixel than for a green pixel. It is also further desirable that the width of the light guide is smaller for a green pixel than for a red pixel.

In the above, it is desirable that the color filter comprises a colorant. The colorant may be a dye or a color pigment. The pigment may be an organic pigment, an inorganic pigment, or a organometallic pigment.

According to a third aspect of the disclosure, it is provided a method for detecting an image using an image sensor, the method comprising (a) providing a plurality of photoelectric conversion units below an insulating layer and a plurality of wires that are embedded in the insulating layer, (b) providing a plurality of light guides embedded in the insulating layer and between the plurality of wires to transmit light to the photoelectric conversion unit, where a horizontal spacing between the light guides of each pair of consecutive pixels among five or more pixels that are arrayed side-by-side in a direction and that are among the plurality of pixels varies non-monotonically across the five or more pixels.

In the third aspect, it is desirable that the image sensor has any of the desirable features from the first aspect.

According to a fourth aspect of the disclosure, an image sensor comprises a pixel array that comprises a plurality of pixels, where each pixel comprises (a) a photoelectric conversion unit below an insulating layer and below a plurality of wires that are also embedded in the insulating layer, and (b) a light guide embedded in the insulating layer and between the plurality of wires to transmit light to the photoelectric conversion unit, where a horizontal spacing between the light guides of each pair of consecutive pixels among five or more pixels that are arrayed side-by-side in a direction and that are among the plurality of pixels alternates between increasing and decreasing across the five or more pixels. The light guide may contain a dye or a color pigment. The color pigment may be an organic pigment or an inorganic pigment or an organometallic pigment.

In the fourth aspect, the pixel may further comprise a color filter coupled to transmit light to the photoelectric conversion unit via the light guide, there being a gap between the color filters of each pair of consecutive pixels among the five or more pixels, the gap having a width that alternates between increasing and decreasing across the five or more pixels. It is desirable that the gap width varies by 0.1 um or more across sixteen pixels arrayed side-by-side in a direction. It is more desirable that the gap width varies by 0.2 um or more across the sixteen pixels.

In the fourth aspect, the pixel may further comprise a color filter coupled to transmit light to the photoelectric conversion unit via the light guide, there being a gap between the color filters of each pair of consecutive pixels among the five or more pixels, and a gap pitch alternates between increasing and decreasing across the five or more pixels, the gap pitch being a horizontal distance (in a plane parallel to the plane of the photoelectric conversion units) between each pair of consecutive centerlines of the gaps. It is desirable that the gap pitch varies by 0.1 um or more across sixteen pixels arrayed side-by-side in a direction. It is more desirable that the gap pitch varies by 0.2 um or more across the sixteen pixels.

According to a seventh aspect of the disclosure, an image sensor comprises a pixel array that comprises a plurality of pixels, where each pixel comprises (a) a photoelectric conversion unit below an insulating layer and below a plurality of wires that are also embedded in the insulating layer, and (b) a light guide embedded in the insulating layer and between the plurality of wires to transmit light to the photoelectric conversion unit, where the light guide has a width that alternates between increasing and decreasing across the five or more pixels. It is further desirable that the width of the light guide is smaller for a pixel among the five or more pixels that is configured to detect lights of shorter wavelengths only than for another pixel among the five or more pixels that is configured to detect lights of longer wavelengths. It is also further desirable that the width of the light guide is smaller for a blue pixel than for a red pixel. It is also further desirable that the width of the light guide is smaller for a blue pixel than for a green pixel. It is also further desirable that the width of the light guide is smaller for a green pixel than for a red pixel.

According to a eighth aspect of the disclosure, it is provided a method for detecting an image using an image sensor, the method comprising (a) providing a plurality of photoelectric conversion units below an insulating layer and a plurality of wires that are embedded in the insulating layer, (b) providing a plurality of light guides embedded in the insulating layer and between the plurality of wires to transmit light to the photoelectric conversion unit, where a horizontal spacing between the light guides of each pair of consecutive pixels among five or more pixels that are arrayed side-by-side in a direction and that are among the plurality of pixels alternates between increasing and decreasing across the five or more pixels.

In the eighth aspect, it is desirable that the image sensor has any of the desirable features from the fourth aspect.

According to a ninth aspect of the disclosure, an image sensor comprises a pixel array that comprises a plurality of pixels, where each pixel comprises (a) a photoelectric conversion unit below an insulating layer and below a plurality of wires that are also embedded in the insulating layer, and (b) a light guide embedded in the insulating layer and between the plurality of wires to transmit light to the photoelectric conversion unit, where a horizontal spacing between the light guides of each pair of consecutive pixels among five or more pixels that are arrayed side-by-side in a direction and that are among the plurality of pixels has a wider horizontal spacing that follows immediately after a narrower spacing and that is itself followed immediately by another narrower spacing across the five or more pixels. The light guide may contain a dye or a color pigment. The color pigment may be an organic pigment or an inorganic pigment or an organometallic pigment.

DETAILED DESCRIPTION

Disclosed is an image sensor that has a pixel array that comprises a plurality of pixels that each includes a photoelectric conversion unit. Each of the pixels includes a light guide that is embedded in an insulating layer and between wires, also embedded in the insulator layer, to transmit a light to the photoelectric conversion unit. The light guide of a pixel that detects lights of shorter wavelengths may have a smaller width at its bottom ("bottom width") than a light guide of another pixel that detects lights of longer wavelengths only. A vertical centerline at a bottom of the light guide may have a larger distance to that of the light guide of an adjacent pixel on a lateral side than that of the light guide of an adjacent pixel on an opposite lateral side. A spacing between a bottom of the light guide and a bottom of the light guide of an adjacent pixel on a lateral side ("bottom spacing") may be larger than that between the bottom of the light guide and a bottom of the light guide of an adjacent pixel on an opposite lateral side. The pixel may comprise a color filter that comprises a color material. A gap may exist between the color filters of each pair of side-by-side pixels among the plurality of pixels. A width of the gap ("gap width") may differ from a pair of side-by-side pixels to another pair of side-by-side pixels. A pitch of the gap ("gap pitch") across three or more pixels arrayed side-by-side in a direction may vary by 15% or less. Having one or more of the above technical features in an image sensor, and in particular a color image sensor, permits higher layout densities of integrated circuit features (e.g. gate electrodes, poly contacts, wires and diffusion contacts) under the insulating layer as well as within the insulating layer. A substrate supports the photoelectric conversion unit and may be a semiconductor substrate lightly doped to a first conductivity type, preferably p-type, and further preferably having a doping concentration between $5e14/cm^3$ and $5e15/cm^3$. The substrate 106 may be a p-epi layer on a heavily doped p-substrate having doping concentration in excess of $1e19/cm^3$. For example, substrate 106 may be of silicon doped with boron to the concentration between $5e14/cm^3$ and $5e15/cm^3$, such as a conventional p-epi layer on a heavily doped p+ substrate (not shown).

Figure 6:
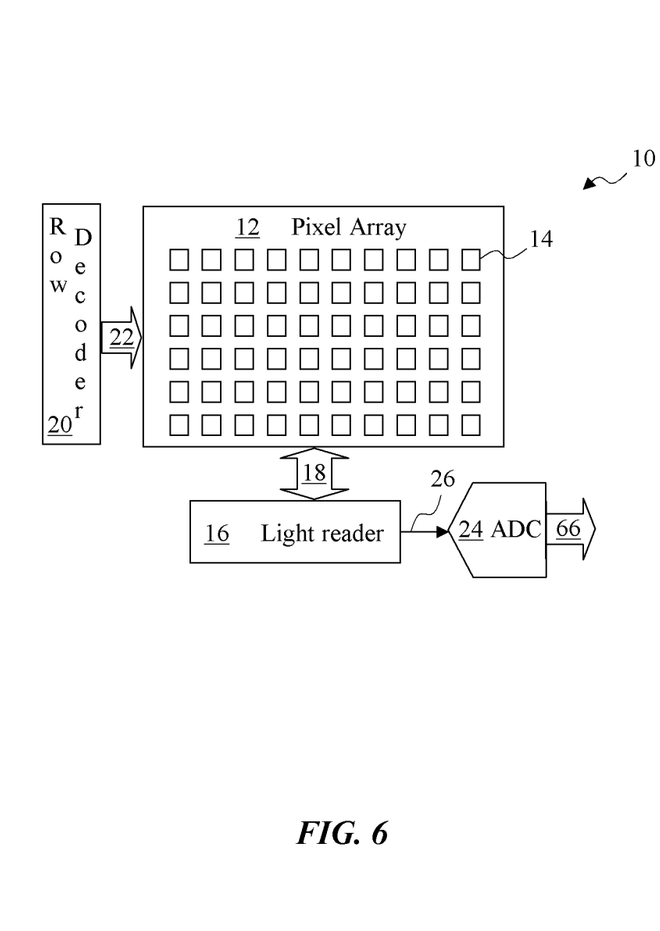
FIG. 6 is a schematic of an image sensor.

Referring to the drawings more particularly by reference numbers, FIG. 6 illustrates an image sensor 10 comprising an array 12 of pixels 14 connected to a row decoder 20 by a group of control signals 22 and to a light reader circuit 16 by a output signals 18 generated from the pixels 14. A light reader circuit 16 samples output signals 18 generated from pixels 14 and may perform subtraction and amplification on samples of the output signals 18 to generate analog signal(s) to be provided to an analog-to-digital converter (ADC) 24. The ADC 24 converts the analog signal(s) to digital image data on ADC output bus 66. If the image sensor 10 is a color image sensor, the pixel array 12 includes a color filter array that comprises color filters arrayed in two dimensions in such a way that there is one color filter for each pixel 14.

Figure 8A:
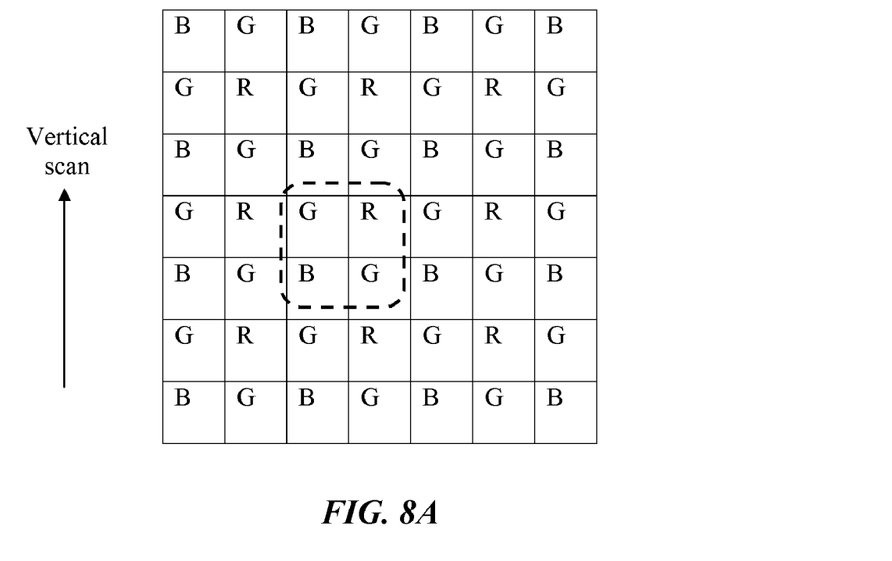
FIG. 8A is a illustration of a primary-color Bayer pattern.

FIG. 8A illustrates an example of a color filter array that may be disposed over and as part of the pixel array 12. FIG. 8A shows a Bayer primary color pattern that comprises a repeated two-dimensional array of a two-by-two block (within dashed line) of color filters each having one of a green color (G), a red color (R) and a blue color (B). A pair of green color filters is disposed along one diagonal of the two-by-two block. A pair of a red color filter and a blue color filter is disposed along the other diagonal. In this embodiment of the color filter array, the color filters are arrayed side-by-side from left to right of the page and from top to bottom of the page.

Figure 8B:
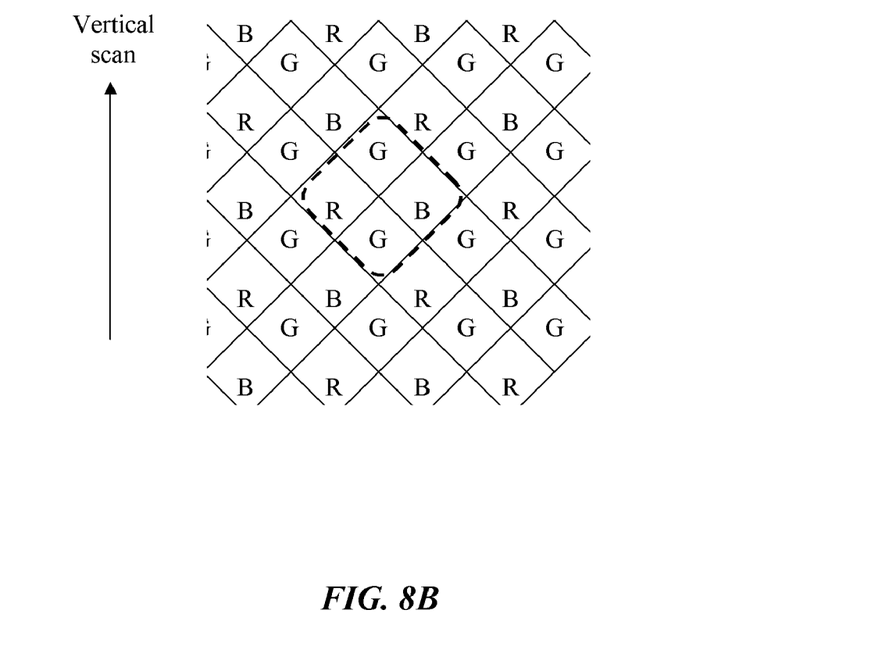
FIG. 8B is an illustration of a primary-color Bayer pattern in 45 degree rotation.

FIG. 8B illustrates an alternative embodiment of the color filter array shown in FIG. 8A. In this variation, the directions in which color filters are arrayed are rotated 45 degrees with respect to the left-to-right and top-to-bottom directions as well as with respect to the direction of bottom-to-top-of-the-image scan (shown in upward-pointing arrow). The pixels 14 are arrayed likewise in an embodiment of image sensor 10 that uses this color filter array.

Figure 9:
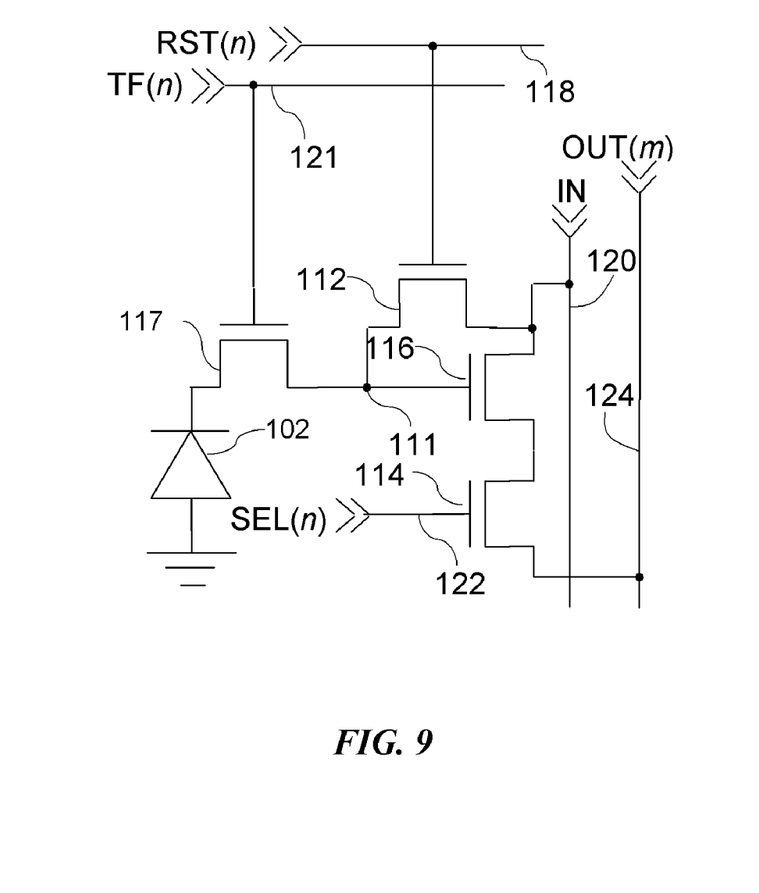
FIG. 9 is a schematic of a 4T pixel.

FIG. 9 shows a schematic for an embodiment of a pixel 14 of the pixel array 12. The pixel 14 includes a photoelectric conversion unit 102. By way of example, the photoelectric conversion unit 102 may be a photodiode. The photoelectric conversion unit 102 may be connected to a reset switch 112 via a transfer gate 117. The photoelectric conversion unit 102 may also be coupled to a select switch 114 through an output (i.e. source-follower) transistor 116. The transistors 112, 114, 116, 117 may be field effect transistors (FETs). A gate of the transfer gate 112 is connected to a TF(n) line 121. A gate of the reset switch 112 is connected to a RST(n) line 118. A drain node of the reset switch 112 may be connected to an IN line 120. A gate of the select switch 114 is connected to a SEL line 122. A source node of the select switch 114 is connected to an OUT line 124. The RST(n) line 118, SEL(n) line 122, and TF(n) line 126 may be shared for an entire row of pixels in the pixel array 12. Likewise, the IN 120 and OUT 124 lines may be shared for an entire column of pixels in the pixel array 12. The RST(n) line 118, SEL(n) line 122 and TF(n) line 121 are connected to the row decoder 20 and are part of the control lines 22. The OUT(m) line 124 is connected to the light reader 16 and is part of the vertical signal lines 18.

Figure 1A:
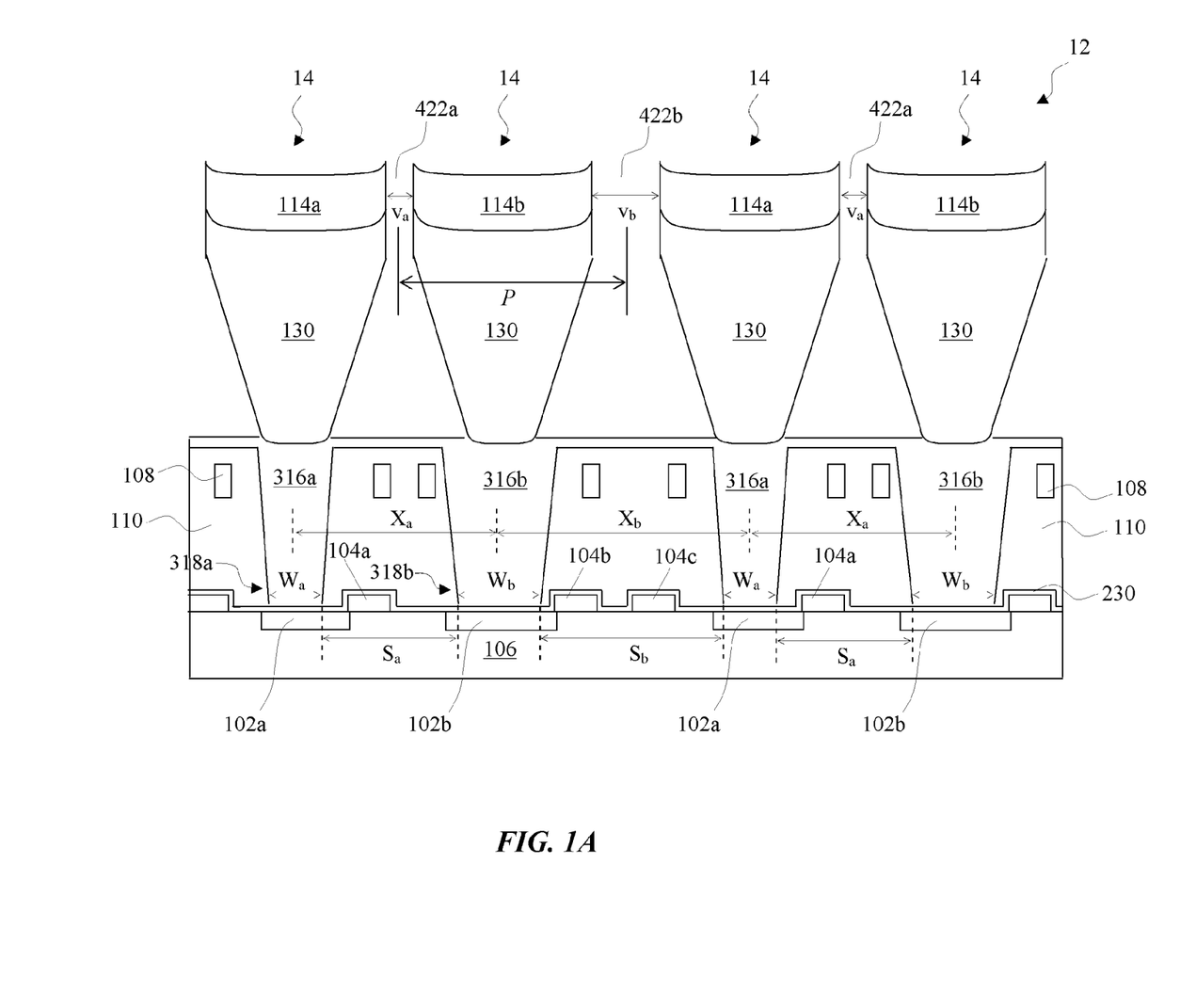
FIG. 1A is an illustration showing a cross-section of four image sensor pixels of an embodiment of the present invention.
Figure 10:
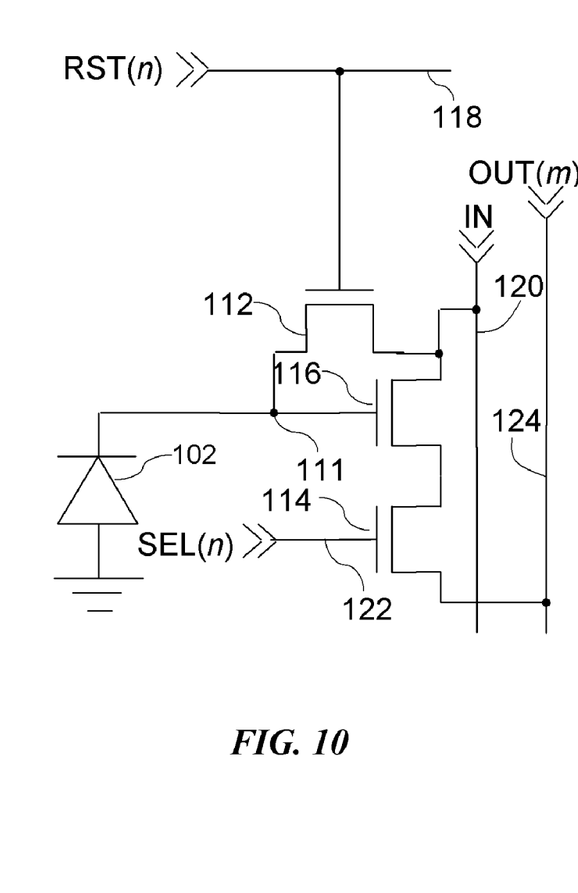
FIG. 10 is a schematic of a 3T pixel.

FIG. 1A shows an embodiment of four adjacent pixels 14 arrayed side-by-side in a direction in a pixel array 12 of a color image sensor 10 on a substrate 106. Each pixel 14 shown includes a photoelectric conversion unit 102a or 102b that converts photonic energy into electrical charges. For a pixel array 12 that uses a 4T pixel architecture (such as shown in FIG. 9) or a variant thereof (such as sharing reset switch 112, select switch 114 and output transistor 116 among multiple pairs of photodiode 102 and transfer switch 117), gate electrodes 104a, 104b may each be a gate electrode of a different transfer switch 117 to transfer the charges. Alternatively, for a pixel array 12 that uses a 3T pixel architecture (such as shown in FIG. 10), gate electrodes 104a, 104b may be gate electrodes of different reset switches 112 to reset the photoelectric conversion units 102a, 102b, respectively. The gate electrode 104c may be a gate electrode of a transistor serving a different function within the pixel array 12, for example a reset switch 112, or a select switch 114, or an output transistor 116. The gate electrodes 104a, 104b, 104c and conversion units 102a, 102b are formed on or in the substrate 106. The gate electrodes 104a, 104b, 104c, the photoelectric conversion units 102a, 102b and the substrate 106 may be covered under a protection layer 230 that comprises a silicon nitride and that has a thickness between 200 to 1000 Angstrom. The protection layer 230 insulates the substrate 106 from metallic ions and moisture. A layer of insulation layer 110 covers the substrate 106. Wires 108 are embedded in the insulating layer 110 and above gate electrodes 104a, 104b, 104c. The wires 108 may be conductive interconnect wires that comprise aluminum or copper. Other interconnect wires (not shown) may be formed in other routing planes, each plane comprising multiple interconnecting wires (that may be metallic) and being at a different heights above the gate electrodes 104a, 104b, 104c than wires 108. A wire 108 may be connected by means of a conductive (such as metallic) via that crosses to an interconnect wire on an adjacent routing plane at a different height.

Photoelectric conversion units 102a, 102b may be paired with lower light guides 316a, 316b, respectively, that are embedded in the insulating layer 110 and between the wires 108. The lower light guides 316a, 316b may comprise a transmissive material, e.g. a silicon nitride such as $Si_3N_4$, that has a higher index of refraction than the insulating layer 110 (being the external material), e.g. a silicon oxide, and use total internal reflection between the light guide and the external material to help keep light from exiting the lower light guides. Alternatively, the lower light guide may be filled with a transparent material such as spin-on-glass (SOG) or a transparent resin of an organic material and may even comprise a color material (such as an organic or inorganic pigment or an organometallic pigment) and have reflective metal coatings on its lateral walls (reflective metal coating type) to reflect light inwards to help keep light from exiting the lower light guide.

Upper light guides 130 may be located above lower light guides 316a, 316b and may comprise either the same material (s) as the lower light guides 316a, 316b or different material (s). The upper light guide 130 and the lower light guide 316a, 316b may be both of the total internal reflection type, or both of the reflective metal coating type, or one of them may be of one type while the other one being of the other type. A top end of the upper light guide 130 is wider than a bottom end, where the upper light guides 130 meet the lower light guides 316a, 316b.

Color filters 114a, 114b are located above the upper light guides 130. The color filter 114a, 114b may each comprise a different color material, or colorant, such as a dye or a organic or inorganic or organometallic pigment. The color filter may comprise a resin in which the dye is dissolved or the organic or inorganic or organometallic color pigment is suspended, where the resin may be organic or comprise a polymer that has at least an organic group such as methyl, ethyl or phenyl (an example being silicone). Alternatively, the color filter may comprise a transmissive inorganic material (e.g. silicon nitride) having particles of a color pigment (e.g. an inorganic color pigment such as iron oxide, a cobalt or manganese or zinc or copper pigment, or an organometallic pigment, or a complex inorganic color pigment) dispersed therein. The color filters 114a, 114b exhibit different colors in white light. Preferably, each has a highest transmittance and a least transmittance of at least 50% and at most 10%, respectively, between wavelengths (in air) of 400 nm to 700 nm. Alternatively, a ratio between the highest and least transmittances shall be more than 4-to-1.

As shown in FIG. 1A, adjacent color filters 114a, 114b have gaps between them. Gaps 422a, 422b between the color filters 114a, 114b have widths of 0.45 um or less. The gaps 422a, 422b may be filled with air or a gas. The gaps 422a, 422b may have a depth of 0.6 um or greater between the adjacent color filters. The gap with the dimensional limitations cited above causes light within the gap to be diverted into the adjacent color filters and to be subsequently guided by light guide(s) to the photoelectric conversion units 102a or 102b. Thus the percentage loss of light impinging on the pixel due to the light passing through and penetrating down below the gap 422a, 422b (henceforth "pixel loss") is substantially reduced.

Figure 1B:
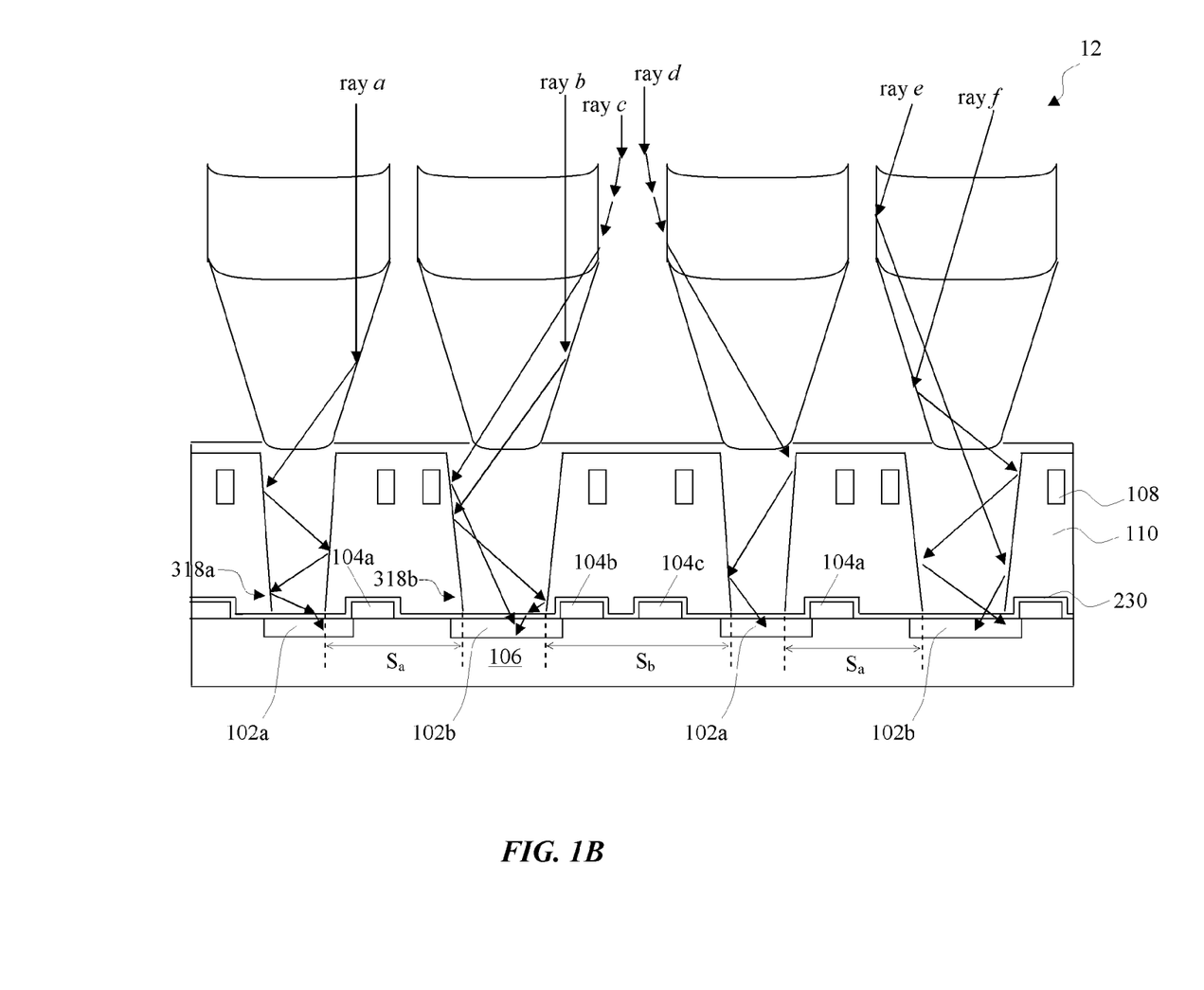
FIG. 1B is a ray tracing diagram for the same cross-section of four image sensor pixels of FIG. 1A.

Together, the color filter 114a (or 114b) and upper 130 and lower 316a (or 316b) light guides constitute a "cascaded light guide" that guides light to the photoelectric conversion unit 102a (or 102b) by means of total internal reflection at interfaces with external media such as the insulator 110. (Alternatively, one or both of the upper and lower light guides may have metal sidewalls to reflect light inwards.) In FIG. 1B, a ray tracing diagram, rays a, b, e and f are shown to experience reflections at sidewalls of the color filters and/or the upper light guides and the lower light guides. Rays c and d that fall into the wider gap between the color filters of the second and third pixels are diverted into the color filters of the second and third pixels respectively and arrive at the respective photoelectric conversion units.

Figure 3:
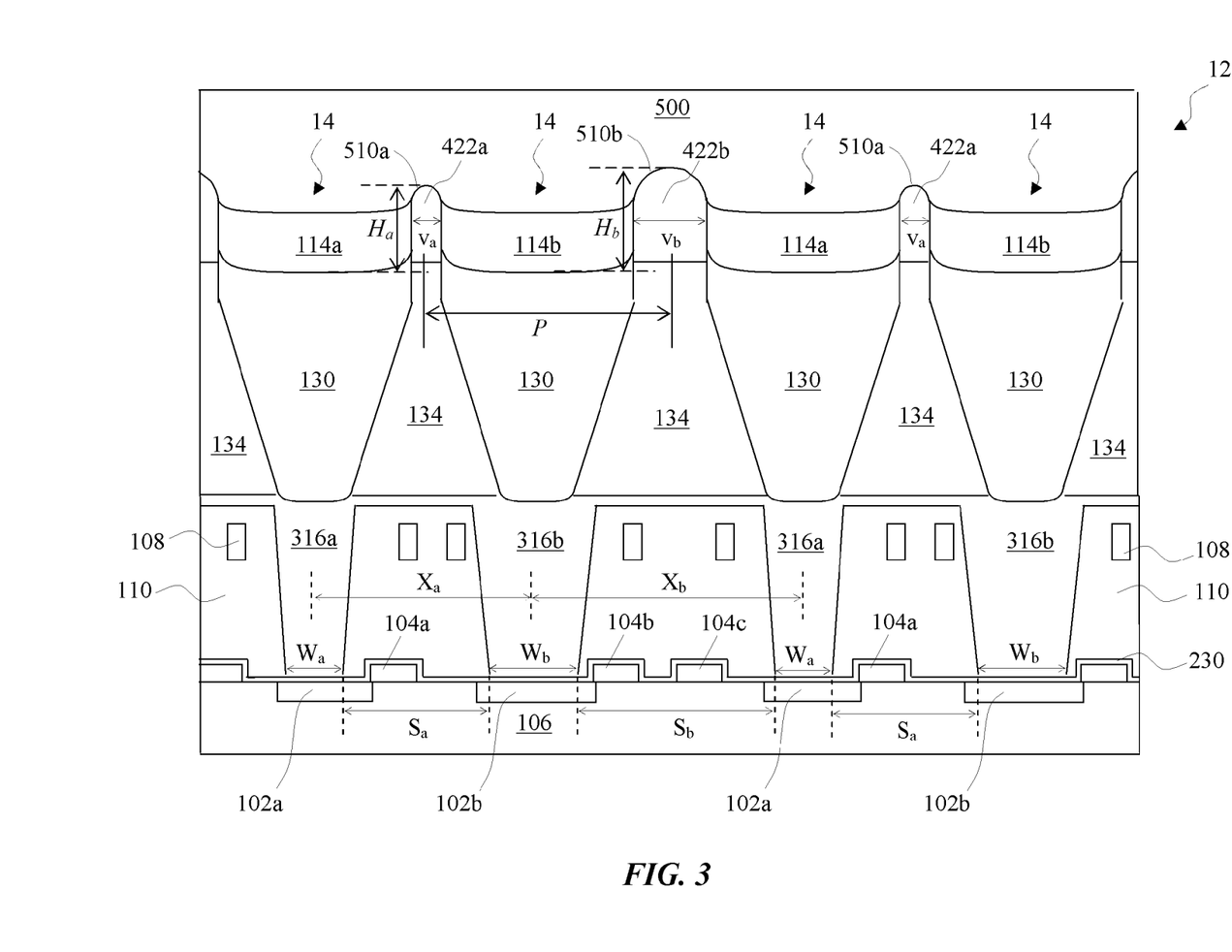
FIG. 3 is an illustration showing a cross-section of four image sensor pixels of an alternative embodiment.

FIG. 3 shows an alternative embodiment of the image sensor 10 in which the gaps 422a, 422b between adjacent color filters are covered under a transparent film 500, and a support film 134 fills in between adjacent upper light guides 134. The support film 134 shall have a lower refractive index than the upper light guide 130 if the upper light guide 130 is of the total internal reflection type. A ceiling 510 of the gap 422a, 422b may be concave with respect to the transparent film 500 (i.e. convex with respect to the gap) such as being in a dome-shape. The gap 422a, 422b may contain air or a gas. Lights that enter the gap from above, crossing the convex ceiling, are diverged towards the adjacent color filters.

Figure 4:
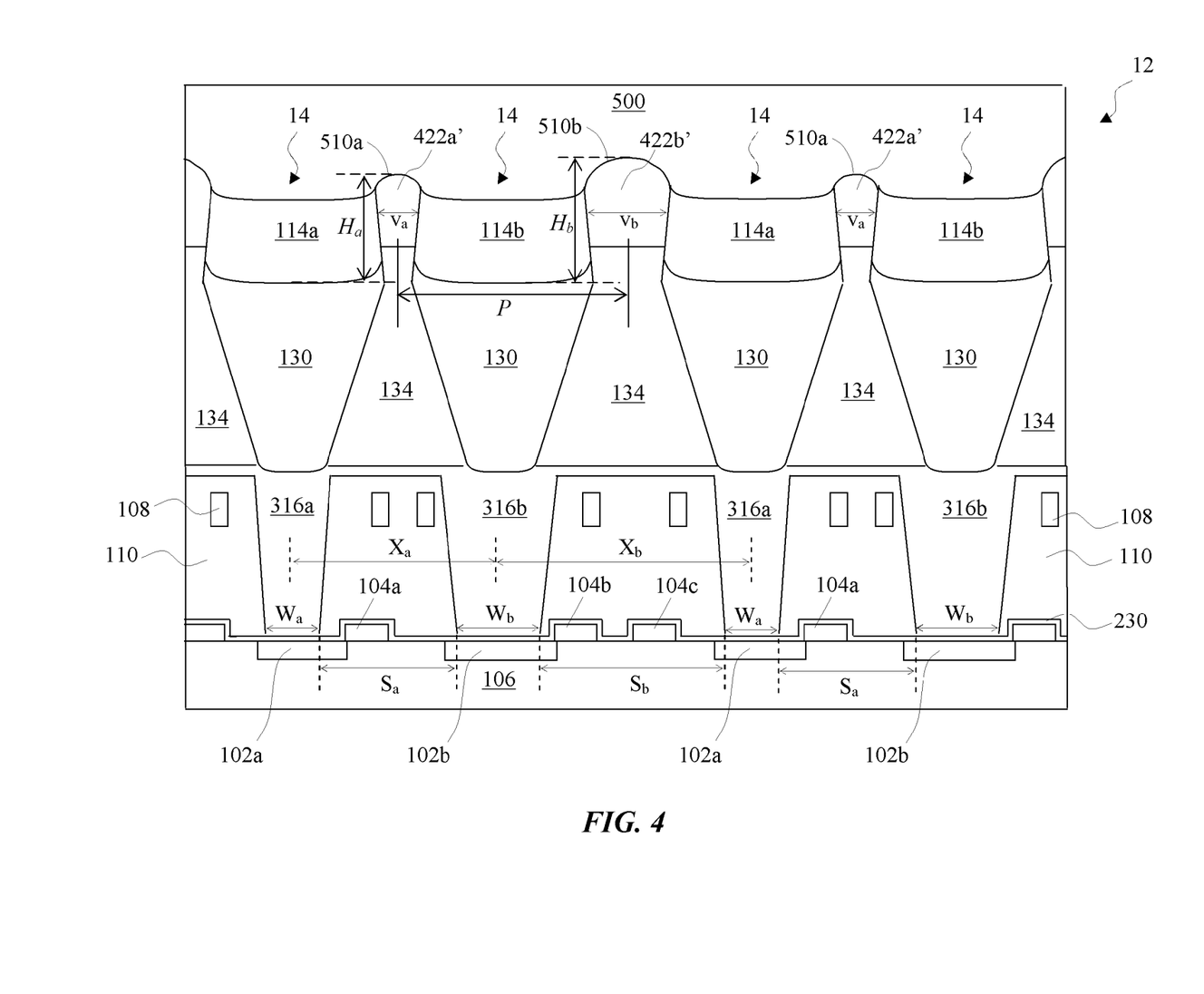
FIG. 4 is an illustration showing a cross-section of four image sensor pixels of an alternative embodiment that is the best mode.

FIG. 4 shows an alternative embodiment in which the embodiment in FIG. 3 is further modified so that the color filters 114a, 114b have sidewalls that incline inwards and the support film 134 has interfaces with the color filters' sidewalls.

Figure 7:
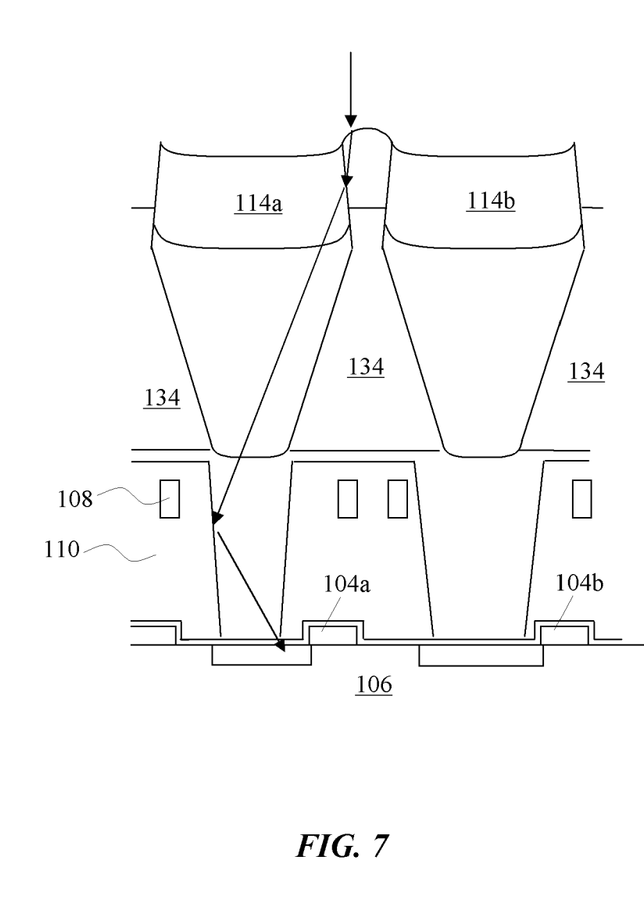
FIG. 7 is a ray tracing diagram for the third embodiment shown in FIG. 4.

As in the second embodiment, across four pixels from left to right, the gap between consecutive color filters becomes narrower, then wider, then narrower again. Although the gap has different width at different height within the gap, for comparison between a wider gap 422b' and a narrower gap 422a', it suffices to measure the gap width at a horizontal level (i.e. one that is parallel to the plane of the photoelectric conversion units) that slices through the color filters and the gaps between them, as shown in FIG. 4. Likewise, for comparison between a wider pitch between a pair of consecutive gaps and a narrower pitch between another pair of consecutive gaps, it suffices to measure at the same horizontal level. FIG. 7 is a ray tracing diagram that shows a trajectory of a light ray that enters the gap between two color filters 114a, 114b. The convexity of the ceiling serves to diverge the light ray towards one of the color filters. A height from a bottom of the color filter to a top of an adjacent ceiling shall be 0.6 um or more. This provides enough depth for light that enters the gap (below the ceiling and laterally adjacent to the color filter) from the ceilings to be diverged into the adjacent color filters. For example, the height is labeled $H_a$, measuring from the bottom of the first (from the left) color filter 114a to the top of the ceiling 510a between the first 114a and second 114b color filters. Likewise, the height is labeled $H_b$, measuring from the bottom of the second 114b color filter to the top of the ceiling 510b between the second 114b and third 114a color filters.

Figure 5:
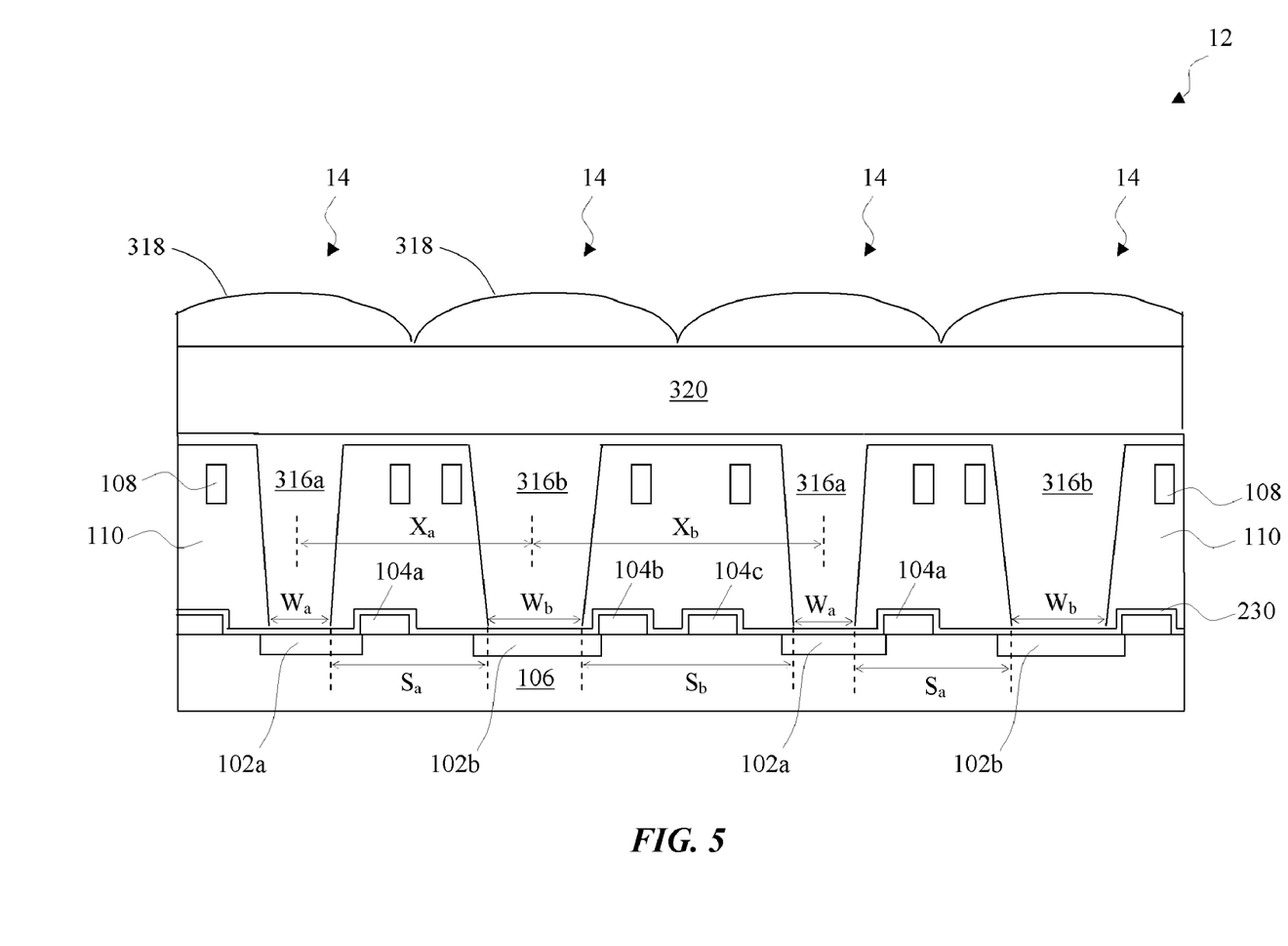
FIG. 5 is an illustration showing a cross-section of four image sensor pixels of an alternative embodiment.

FIG. 5 shows an alternative embodiment in which the upper light guide 130 is dispensed with, and instead microlenses 318 are placed above the lower light guides 316a, 316b, with a transparent planarization layer 320 between the microlenses 318 and the light guides 316a, 316b. The microlenses 318 focus lights into the upper apertures of the light guides 316a, 316b, which in turn transmit the lights down to their respective photoelectric conversion units 102a, 102b. For a color image sensor, the light guides 316a, 316b may comprise colorants such as dyes or an organic or inorganic or organometallic pigments to give different colors to the light guides 316a, 361b according to the colors of the color pattern of the pixel array 12, for example the Bayer pattern.

Alternatively, the gaps 422a, 422b in the embodiments shown in FIGS. 1A, 3, 4 and 5 may contain a transparent (liquid or solid) medium as long as the transparent medium has a refractive index that is lower than the color filters by at least 20%. For example, the transparent medium may be a resin having a refractive index between 1.4 and 1.5 whereas the color filters comprise particles of silicon nitride having their density adjusted such that its refractive index becomes 1.7 or above.

A light guide embedded in the insulator layer 110 and between wires 108 to transmit lights of shorter wavelengths only may have a smaller width at its bottom ("bottom width") than another light guide to transmit lights of longer wavelengths, regardless of whether the light guide uses total internal reflection to keep light from exiting or uses metal coating on its sidewalls. Referring to FIG. 1A, color filters 114a may be blue color filters that have higher transmittances for wavelengths in air between 400 nm to 500 nm than for other wavelengths (hence their pixels are blue pixels), and color filters 114b may be green color filters that have better transmittances for wavelengths in air between 500 nm to 600 nm than for other wavelengths (hence their pixels are green pixels). Accordingly, the lower light guides 316a (for the blue pixels) that transmit blue lights have a smaller bottom width $W_a$ of its bottom 318a than the bottom width $W_b$ of a bottom 318b of the lower light guides 316b (for the green pixels) that transmit green lights only ($W_a<W_b$). Generally, the lower light guides 316a are narrower than the lower light guides 316b. Alternatively, color filters 114b shown in FIG. 1A may be red color filters that have higher transmittances for wavelengths in air between 600 nm and 700 nm than for other wavelengths (hence their pixels are red pixels). Alternatively, color filters 114a may be green color filters whereas color filters 114b being red color filters.

FIG. 1A also shows that the bottom width varies non-monotonically across pixels that are arrayed side-by-side in a direction. In FIG. 1A, from left to right, the sequence of bottom width is $W_a$, $W_b$, $W_a$, $W_b$, where $W_a<W_b$, exhibiting a sequence of variation of {increase, decrease, increase}. In an alternative embodiment, a different sequence of variation of the bottom width is possible while being non-monotonic, i.e. an increase in the bottom width is followed by a decrease and further followed by another increase, and/or a decrease is followed by an increase and further followed by another decrease. In particular, the sequence of variation may be a non-monotonic sequence that is repeated. For example, the variation of bottom width may follow a pattern of {increase, no change, decrease, increase, decrease} that is repeated.

In FIG. 1A, color filter 114a may be a blue color filter and a lower light guide 316a has a bottom width $W_a$ at its bottom. Further to the right in FIG. 1A, color filter 114b may be a green color filter and a lower light guide 316b has a bottom width $W_b$ at its bottom, where the bottom width $W_b$ is larger than the bottom width $W_a$ ($W_a<W_b$). For a lower light guide embedded in the insulating layer 110 to transmit lights of wavelengths up to 500 nm, its bottom width is preferably between 0.2 um to 0.35 um, more preferably 0.27 um+/−10%. For a lower light guide to transmit lights having wavelengths up to 600 nm, its bottom width should preferably be between 0.25 um to 0.4 um, more preferably within 0.33 um+/−10%. For a lower light guide to transmit lights having wavelengths up to 700 nm, its bottom width should preferably be between 0.3 um to 0.5 um, more preferably within 0.4 um+/−10%. Having smaller widths at the bottom permits higher packing densities of integrated circuit features (such as gate electrodes 104a, 104b and 104c, polysilicon contacts and diffusion contacts) under the insulator 110.

The gaps 422a, 422b may have the width of gap between the color filters of side-by-side pixels ("gap width") vary non-monotonically among themselves. Across a first, a second and a third pixels, arrayed side-by-side in this order in a direction, the gap may be wider between the first and the second pixels than between the second and the third pixels. For example, FIG. 1A shows two different gap widths $V_a$, $V_b$ between four adjacent pixels arrayed side-by-side in a particular direction.

A distance P ("gap pitch") between centerlines of consecutive gaps 422a, 422b may be maintained essentially constant (i.e. within 5% of its maximal value) across five or more pixels arrayed side-by-side in a direction while the gap width varies non-monotonically.

Alternatively, the gap pitch P may be allowed non-monotonic variation having a maximum-to-minimum difference of at most 20% of its maximum value across a predetermined number of pixels arrayed side-by-side in a direction. The predetermined number may be less than 16, more preferably not more than 8. More particularly, the gap pitch P may alternately increase and decrease across pixels arrayed in a direction. The gap pitch P may vary by as much as 0.1 um, more preferably 0.2 um, for an average pixel pitch of 1 um. Letting the gap pitch P vary non-monotonically in conjunction with the bottom spacing (or more generally a horizontal spacing between consecutive lower light guides) gives the lower light guides more freedom to place themselves more optimally while retaining good capturing of light. In this way, a lower light guide can shift to one side to make the spacing on this side narrower while making the spacing on the opposite side wider enough to accommodate an additional integrated circuit feature such as a gate electrode or a diffusion contact, thus helping to support a denser pixel array.

A distance between vertical centerlines of consecutive lower light guides ("bottom pitch") in a vertical cross section across five or more pixels arrayed side-by-side in a particular direction may have a non-monotonic variation. For example, FIG. 1A shows two different bottom pitches $X_a$, $X_b$ between vertical centerlines (shown as vertical dashed lines in FIG. 1A) of three lower light guides 316a, 316b on the left. The larger bottom pitch $X_b$ is below the larger gap width $v_b$ of gap 422b, whereas the smaller bottom pitch $X_a$ is below the smaller gap width $v_a$ of first gap 422a. The larger bottom pitch $X_b$ helps to accommodate more integrated circuit features under the insulating layer 110 than the smaller bottom pitch $X_a$ does.

As FIG. 1A shows, the bottom spacing $S_a$ between the first pixel (counting from the left) and the second pixel is same as the bottom spacing $S_a$ between the third pixel and the fourth pixel, and is smaller than the bottom spacing $S_b$ between the second and third pixels. The larger bottom spacing $S_b$ between the second and third pixels accommodates more integrated circuit features under the insulator or above and adjacent to the substrate 106, such features including gate electrodes (such as gate electrodes 104b, 104c as shown in FIG. 1A), polysilicon contact (not shown), diffusion contact (not shown), and wires. Conventional pixel array, with uniform spacing between light guides, would have to have all spacings as wide as $S_b$, even though such wider spacing is not needed between the first and second pixels nor between the third and fourth pixels, resulting in a problem of having less than optimal pixel density.

Figure 2A:
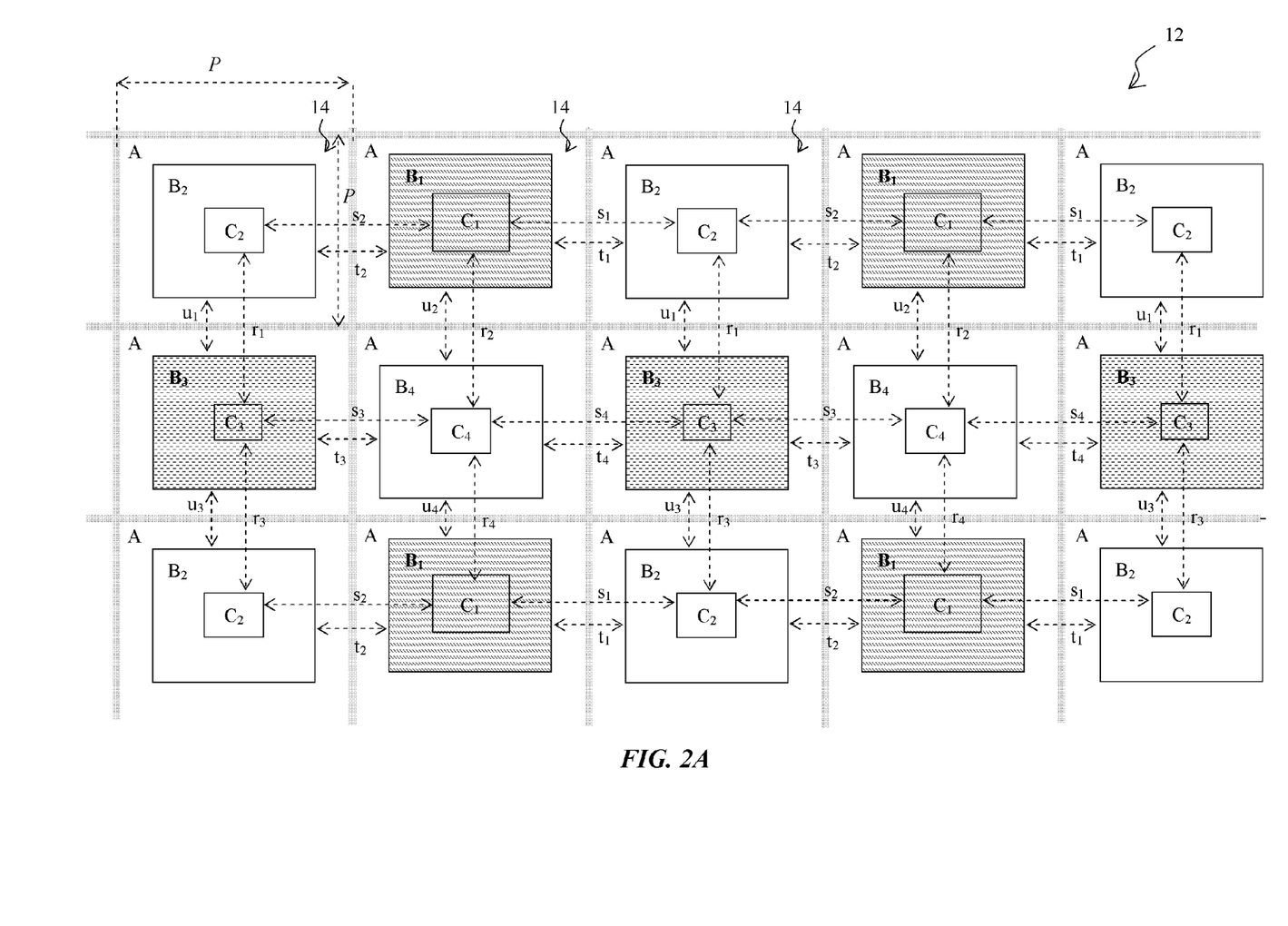
FIG. 2A is an illustration showing a top view of fifteen pixels within an array.

FIG. 2A is a top view looking down at the pixel array 12 from above, showing fifteen pixels 14 in three rows and five columns of the first, second and third embodiments of the pixel array 12 where pixels are arranged side-by-side in left-to-right and top-to-bottom directions. Centerlines of the gaps are drawn in thick, gray lines between each pair of side-by-side pixels. The area B represents a top surface area of the upper light guide 130 and the area C represents a bottom surface area of the lower light guide 316a, 316b. The area A minus the area B is the area of the gap 422a, 422b between color filters, where A represents a pixel area. FIG. 2A shows four different pairs of areas B and C: $B_1$ and $C_1$, $B_2$ and $C_2$, $B_3$ and $C_3$, and $B_4$ and $C_4$. These four different pairs are repeated in a regular pattern.

FIG. 1A can be seen as a vertical section of the first to fourth pixels, counting from the left, of the middle row in FIG. 2A. In this context, $v_a=t_3$, $v_b=t_4$, $S_a=s_3$, and $S_b=s_4$.

As FIG. 2A shows, the gaps between color filters of side-by-side pixels have widths $t_1, t_2, t_3, t_4, u_1, u_2, u_3$ and $u_4$ that are repeated. Along any left-to-right or top-to-bottom cut in FIG. 2A, the gap widths $t_1$ to $t_4$ or $u_1$ to $u_4$ are varied among themselves while the pitch P from a centerline of a first gap to a centerline of the next first gap remains constant. The gap width varies across plural pixels arrayed side-by-side in a direction perpendicular to the gap, which in FIG. 2A is from left to right (or from right to left) for a gap on the left or right (as shown in the top view looking down at the pixel array in FIG. 2A) of a pixel or is from top to bottom (or from bottom to top) for a gap above or below (again, as shown in the top view looking down at the pixel array in FIG. 2A) a pixel. The variation is non-monotonic, i.e. an increase is followed by a decrease that in turn is followed by another increase, and/or a decrease is followed by an increase further followed by another decrease. For example, in the top row, from left to right, the gap width varies in a sequence of $t_2, t_1, t_2, t_1$, where $t_2<t_1$, which exhibits a sequence of variation in the pattern of {increase, decrease, increase}; in the middle row, a sequence of $t_3, t_4, t_3, t_4$, where $t_3<t_4$, which exhibits a sequence of variation in the pattern of {increase, decrease, increase}; and the bottom row, same sequence as the top row. More particularly, the gap width alternates between wider gap widths and narrower gap widths across side-by-side pixels arrayed in a direction. Although in each of these two sequences of gap widths, the variation of gap width is shown to alternate between increasing and decreasing, in an alternative embodiment a different sequence of variation of the gap width is possible as long as it is non-monotonic. In particular, the sequence of variation may be a non-monotonic sequence that is repeated. For example, the variation of gap width may follow a pattern of {increase, unchanged, decrease, increase, decrease} that is repeated.

FIG. 2A also shows that, likewise, the bottom spacing can vary across pixels that are arrayed side-by-side in a direction. For example, in the middle row, from left to right, the sequence of bottom spacing alternate between $s_3$ and $s_4$, where $s_3<s_4$, exhibiting a sequence of variation of {increase, decrease, increase}. More particularly, the bottom spacing alternates between larger spacing and smaller spacing across pixels arrayed side-by-side in a direction. Conventional image sensor pixel array that uses light guides places the light guides uniformly displaced from each other, thus is unable to utilize a small space between light guides and too small to accommodate an integrated circuit feature such as a gate electrode. The embodiment shown in FIG. 2A is able to bring the two light guides on the left of the second row closer to each other and also the next two light guides of the second row closer to each other in order to create a wider space in the middle (i.e. between the second and third light guides) so that an additional gate electrode 104c can fit in. Conventional pixel array, with uniform spacing between light guides, would have to have all spacings being wider even though the wider spacing is only needed between certain pairs of laterally adjacent light guides. In an alternative embodiment, any sequence of variation of bottom spacing is possible as long as the sequence of variation is non-monotonic, i.e. an increase in the bottom spacing is followed by a decrease and further followed by another increase, and/or a decrease is followed by an increase and further followed by another decrease. In particular, the sequence of variation may be a non-monotonic sequence that is repeated. For example, the variation of bottom spacing may follow a pattern of {increase, increase, decrease, increase, decrease} that is repeated. Preferably, the bottom spacing varies by 0.2 um or more within a group of five consecutive pixels.

FIG. 2A also shows that the bottom width varies non-monotonically from left to right in the second row in a bottom-width sequence of $W_a, W_b, W_a, W_b, W_a$, where $W_a<W_b$, exhibiting a variation pattern of {increase, decrease, increase, decrease}, which is non-monotonic. In particular, for the four pixels in the top two rows and leftmost two columns, it is shown that the bottom width is smallest for the bottom area $C_3$, largest for the bottom area $C_1$, and intermediate for the bottom areas $C_2$ and $C_4$. In an embodiment where the primary-color Bayer pattern is used for the color filters over the pixel array 12, the pixels that have the bottom areas $C_2$ and $C_4$ may be the green pixels, the pixel that has the bottom area $C_1$ may be the red pixel, and the pixel that has the bottom area $C_3$ may be the blue pixel. In a direction in which alternate pixels alternate between two different colors, the width of the lower light guides should similarly alternate so that the lower light guides and their spacings are of the optimum size for guiding the light to be detected whilst also optimizing the space for integrated circuit features. Thus, in this example where bottom areas $C_3$ corresponds to blue pixels and bottom areas $C_4$ corresponds to green pixels, in the second row, where in the left-to-right direction alternate pixels alternate between blue and green pixels, the width of light guides are optimized accordingly, alternating between narrower widths (for blue pixels) and wider widths (for green pixel), saving space between the light guides for laying integrated circuit features such as gate electrodes and contacts. Likewise, in the first row, where alternate pixels alternate between green and red pixels, the width of light guides alternate between narrower widths (for green pixels) and wider widths (for red pixels).

More generally, for purposes of comparing widths of the light guides embedded in the insulating layer 110 and of comparing horizontal spacings between pairs of consecutives ones among these light guides, the widths and horizontal spacings may be measured at a horizontal level (i.e. one that is parallel to the plane of the photoelectric conversion units) between the gate electrode 104a, 104b and the wires 108. Within this range of heights, the horizontal spacing (and hence the width) is relevant, for it affects how densely the integrated circuit features in and/or under the insulating layer 110 can be packed together, such integrated circuit features including gate electrodes, polysilicon routing wire (not shown), polysilicon contact (not shown), diffusion contact (not shown), and metal wires. This horizontal spacing should be varied non-monotonically across five or more pixels arrayed side-by-side in a direction, as shown in FIG. 1A, to permit a light guide to shift to one side to occupy a small space too small to accommodate an integrated circuit feature so that more space is aggregated on the other side to become large enough to accommodate an integrated circuit feature. Preferably, this variation exhibits itself across eight or fewer pixels arrayed side-by-side in a direction. Further preferably, this horizontal spacing exhibits a variation of 0.1 um or larger between the widest and the narrowest horizontal spacings between consecutive light guides across the eight or fewer pixels, more preferably within a group of five consecutive pixels. Still further preferably, the variation is 0.2 um or larger. Making this width of the light guide as small as possible (without impeding the transmission of light) contributes to widening the horizontal spacing, thus benefiting denser packing of integrated circuit features in and under the insulating layer 110 and denser packing of pixels in the pixel array 12. Preferably, this width is varied non-monotonically across five or more pixels arrayed side-by-side in a direction as shown in FIG. 1A to take advantage of the fact that this width can be smaller for a light guide that transmits lights of shorter wavelengths only than for a light guide that transmits lights of longer wavelengths. For a light guide embedded in the insulating layer 110 to transmit lights of wavelengths-in-air between up to 500 nm, this width is preferably between 0.2 um to 0.35 um, more preferably 0.27 um+/−10%. For a light guide to transmit lights having wavelengths-in-air up to 600 nm, this width should preferably be between 0.25 um to 0.4 um, more preferably within 0.33 um+/−10%. For a light guide to transmit lights having wavelengths-in-air up to 700 nm, this width should preferably be between 0.3 um to 0.5 um, more preferably within 0.4 um+/−10%.

Non-monotonically varying the horizontal spacing between consecutive light guides at a horizontal level (i.e. one that is parallel to the plane of the photoelectric conversion units) between a wire 108 and a gate electrode 104a (or in particular the bottom spacing) and/or a horizontal pitch between light guides at a height between a wire 108 and a gate electrode 104a, inclusive, (or in particular the bottom pitch) permits a light guide to shift to one side to occupy a small space too small to accommodate an integrated circuit feature so that more space is aggregated on the other side to become large enough to accommodate an integrated circuit feature. This can be seen in FIG. 1A where an increased horizontal spacing between consecutive light guides at any horizontal level (i.e. one that is parallel to the plane of the photoelectric conversion units) between wires 108 and the gate electrodes 104a, 140b, 104c, inclusive, (or in particular the bottom spacing $S_b$) between the second and third (counting from the left) lower light guides accommodates an extra gate electrode 104c than would be possible if all lower light guides were equally spaced.

Non-monotonically varying the gap width and/or the gap pitch between color filters permits the color filters to shift with the respective lower light guides in such a manner that the respective lower light guides remain coupled to receive light from the respective color filters.

Where the gap is filled with air, or gas(es), or a liquid or solid medium having a lower refractive index than the color filter, or where a convex ceiling is over the gap in case where a refractive index above the ceiling is higher than a refractive index under the ceiling, light remains able to diverge from the gap into the color filters even when the gap width changes. Therefore, in a sequence of consecutive first, second, third and fourth color filters, the second color filter can be shifted closer to the first color filter and the third color filter can be shifted closer to the fourth color filter while all four remain effective in the gathering of light. As shown in FIG. 1B, ray c and ray d that fall into the wider gap between color filters of the second and third pixels are still captured by the respective color filters and transmitted to the respective photoelectric conversion units. Having gaps between the color filters and being able to reduce the gap widths for some gaps while widening a gap between those gaps that become narrower permits the lower light guide below the color filters to have similarly reduced spacings below the narrower gaps and widened spacing below the widened gap while retaining good light capture of the pixels involved.

Figure 2B:
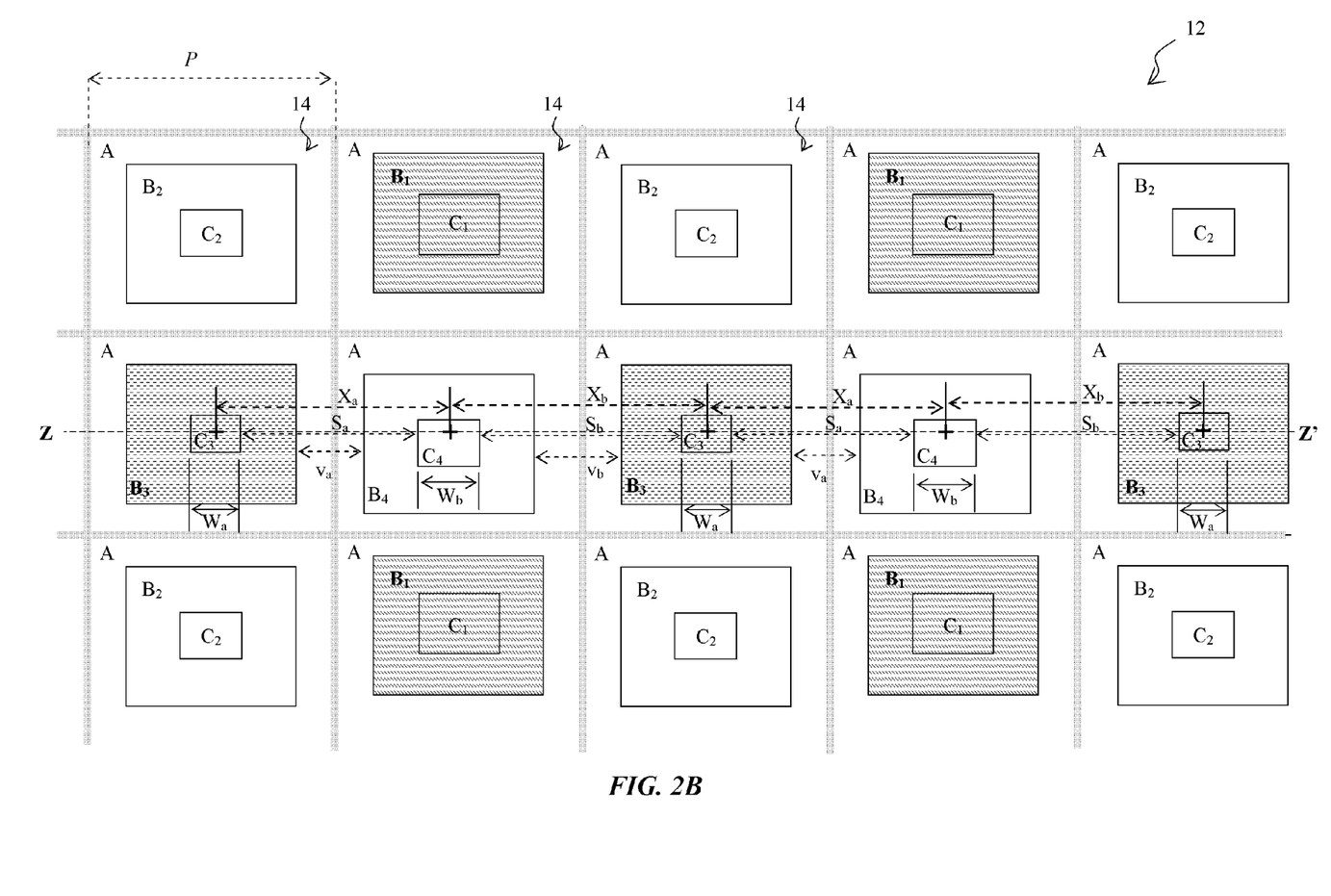
FIG. 2B shows the same top view of fifteen pixels.

FIG. 2B shows the same top view of the fifteen pixels in FIG. 2A. FIG. 1A can be seen as a vertical section of the first to fourth pixels counting from the left along the cut line ZZ' in FIG. 2B. The thick "+" marks within the bottom areas and on the cut line ZZ' represent the vertical centerlines (shown in FIG. 1A as dashed lines) of the lower light guides of these pixels in the plane that is perpendicular to the substrate 106 and that contains the cut line ZZ'. Bottom pitches $X_a$, $X_b$ between the four pixels along the cutline ZZ' are shown to be non-monotonically changing. In particular, the sequence of the bottom pitch $\{X_a, X_b, X_a, X_b\}$ along the cutline ZZ' exhibits a pattern of {increase, decrease, increase}.

The description above has shown how packing density of integrated circuit features can be enhanced by non-monotonic variations in a horizontal spacing between consecutive light guides of pixels arrayed in a direction (in particular, the bottom spacing). Non-monotonic variation in the horizontal spacing (in particular, the bottom spacing) is helped by non-monotonic variations in any one or more of the following: a horizontal pitch between consecutive light guides of pixels arrayed in a direction (in particular, the bottom pitch), gap width, and gap pitch. For example, the gap pitch may be allowed to vary by up to Preferably, the non-monotonicity of the variation happens within a range of a small number of pixels arrayed side-by-side in a direction, for example 32 pixels, or for example 16 pixels, or more preferably within 8 pixels. Within such range, the variation(s) exhibits an increase followed by a decrease further followed by another increase, or a decrease followed by an increase followed by another decrease.

The description above also shows how the packing density can be enhanced by optimizing the width of light guides embedded in the insulating layers for the different colors of light they transmit so as to take up the least space possible. Light guides that transmit lights of shorter wavelengths only should be narrower than light guides that transmit lights of longer wavelengths.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

For example, pixels in a pixel array may be arranged side-by-side in directions that make 45 degrees with the left-to-right and top-to-bottom directions (parallel to the plane of the photoelectric conversion units).

For example, the top/bottom opening of the upper/lower light guide may take a different shape than a rectangle, such as an octagon or a rectangle that has rounded corners.

What is claimed is:

1. An image sensor comprising a pixel array that comprises a plurality of pixels, each pixel comprising:
   a photoelectric conversion unit below an insulating layer; and,
   a light guide, said light guide being embedded in the insulating layer and between a plurality of wires, also embedded in the insulating layer, to transmit light to said photoelectric conversion unit, said light guide having a width that alternates between increasing and decreasing across five or more pixels.

2. The image sensor of claim 1, wherein the width of said light guide is smaller for a pixel among the five or more pixels that is configured to detect lights of shorter wavelengths only than for another pixel among the five or more pixels that is configured to detect lights of longer wavelengths.

3. The image sensor of claim 1, wherein the width of said light guide is smaller for a blue pixel than for a red pixel.

4. The image sensor of claim 1, wherein the width of said light guide is smaller for a blue pixel than for a green pixel.

5. The image sensor of claim 1, wherein the width of said light guide is smaller for a green pixel than for a red pixel.

6. A method for detecting an image using a solid-state image sensor supported by a substrate, comprising:

providing a plurality of photoelectric conversion units arrayed in a direction that is parallel to the substrate, each one of the plurality of photoelectric conversion units being for a different one of a plurality of pixels, a plurality of wires being embedded in an insulating layer disposed above the substrate; and, providing a plurality of light guides arrayed side-by-side in the direction and embedded in the insulating layer and between the plurality of wires, each of the plurality of light guides being coupled to transmit light to a different one among the plurality of photoelectric conversion units, wherein each one of the plurality of light guides has a width measured at a horizontal level between a gate electrode on the substrate and the plurality of wires, inclusive, and said width alternates between increasing and decreasing across five or more adjacent pixels.

7. The method of claim 6, wherein the width is smaller for a pixel among the five or more pixels that is configured to detect lights of shorter wavelengths only than for another pixel among the five or more pixels that is configured to detect lights of longer wavelengths.

8. The method of claim 6, wherein the width is smaller for a blue pixel than for a red pixel.

9. The method of claim 6, wherein the width is smaller for a blue pixel than for a green pixel.

10. The method of claim 6, wherein the width is smaller for a green pixel than for a red pixel.

* * * * *